United States Patent
Liu et al.

(10) Patent No.: US 11,430,625 B2
(45) Date of Patent: *Aug. 30, 2022

(54) ELECTRON SOURCE OPERATING METHOD

(71) Applicant: 38th Research Institute, China Electronics Technology Group Corporation, Anhui (CN)

(72) Inventors: Huarong Liu, Anhui (CN); Xueming Jin, Anhui (CN); Yuxuan Qi, Anhui (CN); Xuehui Wang, Anhui (CN); Yijing Li, Anhui (CN); Junting Wang, Anhui (CN); Chunning Zheng, Anhui (CN); Qing Qian, Anhui (CN); Tingting Luo, Anhui (CN); Zhonglin Dong, Anhui (CN)

(73) Assignee: 38th Research Institute, China Electronics Technology Group Corporation, Anhui (CN)

( * ) Notice: Subject to any disclaimer, the term of this patent is extended or adjusted under 35 U.S.C. 154(b) by 164 days.

This patent is subject to a terminal disclaimer.

(21) Appl. No.: 16/966,910

(22) PCT Filed: Dec. 27, 2018

(86) PCT No.: PCT/CN2018/124331
§ 371 (c)(1),
(2) Date: Aug. 3, 2020

(87) PCT Pub. No.: WO2020/073512
PCT Pub. Date: Apr. 16, 2020

(65) Prior Publication Data
US 2021/0050172 A1 Feb. 18, 2021

(30) Foreign Application Priority Data

Oct. 12, 2018 (CN) .......................... 201811190748.7

(51) Int. Cl.
H01J 1/304 (2006.01)
H01J 3/02 (2006.01)
H01J 37/073 (2006.01)

(52) U.S. Cl.
CPC ............ H01J 1/3044 (2013.01); H01J 3/022 (2013.01); H01J 37/073 (2013.01)

(58) Field of Classification Search
None
See application file for complete search history.

(56) References Cited

U.S. PATENT DOCUMENTS 6,281,626 B1  8/2001 Nakamura et al.
6,573,642 B1  6/2003 Vonallmen et al.
(Continued)

FOREIGN PATENT DOCUMENTS

CN  102394204 A  3/2012
CN  102629538 A  8/2012
(Continued)

OTHER PUBLICATIONS

"First Office Action and English language translation", CN Application No. 201811190748.7, dated Sep. 2, 2020, 18 pp.
(Continued)

*Primary Examiner* — Ashok Patel
(74) *Attorney, Agent, or Firm* — Myers Bigel, P.A.

(57) ABSTRACT

The present disclosure provides an electron source operating method, the electron source including at least one emission site fixed on a tip, the emission site being a reaction product formed by metal atoms of a surface of the tip and gas molecules under an electric field, and the operating method comprises emitting electrons by controlling operating parameters of the electron source.

19 Claims, 7 Drawing Sheets

(56) References Cited

U.S. PATENT DOCUMENTS

| | | |
|---|---|---|
| 7,431,856 B2 | 10/2008 | Rezeq et al. |
| 8,766,542 B2 | 7/2014 | Cho et al. |
| 9,023,226 B2 | 5/2015 | Liu et al. |
| 2013/0020496 A1* | 1/2013 | Liu .................. H01J 1/3044 250/493.1 |
| 2013/0049568 A1 | 2/2013 | Nonogaki et al. |
| 2013/0112138 A1* | 5/2013 | Liu ...................... C23F 4/02 250/493.1 |
| 2013/0200788 A1 | 8/2013 | Cho et al. |
| 2014/0077684 A1 | 3/2014 | Liu et al. |
| 2015/0002009 A1 | 1/2015 | Zhang et al. |
| 2015/0054398 A1 | 2/2015 | Yan |
| 2018/0005791 A1 | 1/2018 | Schultz et al. |

FOREIGN PATENT DOCUMENTS

| | | |
|---|---|---|
| CN | 102651295 A | 8/2012 |
| CN | 102789946 A | 11/2012 |
| CN | 102789947 A | 11/2012 |
| CN | 104347335 A | 2/2015 |
| CN | 104704601 A | 6/2015 |
| CN | 105140091 A | 12/2015 |
| CN | 107851545 A | 3/2018 |
| EP | 2546862 A1 | 1/2013 |
| JP | S5912533 A | 1/1984 |
| JP | 7-192669 A | 7/1995 |
| JP | 2003100244 A | 4/2003 |
| JP | 2011171088 A | 9/2011 |
| JP | 5551830 B2 | 5/2014 |

OTHER PUBLICATIONS

International Search Report (English translation) and Written Opinion, International Application No. PCT/CN2018/124331, Jul. 15, 2019, 5 pp.

Extended European Search Report corresponding to EP18936479.7; dated Jul. 12, 2021 (13 pages).

* cited by examiner

ELECTRON SOURCE OPERATING METHOD

CROSS-REFERENCE TO RELATED APPLICATION(S)

This application is a Section 371 National Stage Application of International Application No. PCT/CN2018/124331, filed on Dec. 27, 2018, entitled "ELECTRON SOURCE OPERATING METHOD", which claims priority to a Chinese Patent Application No. 201811190748.7, filed with the Chinese Patent Office on Oct. 12, 2018 and entitled "ELECTRON SOURCE OPERATING METHOD", which is incorporated herein by reference entirely.

TECHNICAL FIELD

The present disclosure relates to the field of electron source technology, and more particularly, the present disclosure relates to an electron source operating method.

BACKGROUND

Free electrons in the metal can be emitted under certain conditions. If a cathode is made of metal and made into a very fine tip, and applied with a voltage of thousands of volts in a vacuum, electrons in the metal can be emitted from the cold metal cathode. This method of emitting electrons is called field emission and belongs to cold cathode emission.

For an electron source, the most important indicator is the brightness, which directly determines the beam quality. At the extraction voltage V0, the brightness may be as shown in equation (1):

$$B = \frac{I}{S \times \Omega} \propto \frac{I}{d^2 \times \alpha^2} \quad (1)$$

Wherein, B is the brightness, I is the emission current, S is the equivalent emission area, d is the equivalent diameter, $\Omega$ is the solid angle, and $\alpha$ is the half opening angle. Further, the brightness B is proportional to the acceleration voltage $V_a$ as shown in equation (2).

$$B \propto V_a \quad (2)$$

From equation (1), in order to obtain high brightness, it is necessary to increase I, and to reduce a and d as much as possible. In addition, the lower the extraction voltage V0 required to obtain a certain emission current, the better, and this requires that the emitting surface of the tip has a lower work function and a sharper head structure. In addition, another key indicator of the electron source is monochromaticity, which can be expressed by the energy spead δE.

Based on the above considerations, the most ideal electron source is the cold field emission electron source (CFE). The brightness of the CFE is higher than that of other kinds of electron sources by about one order of magnitude, and the CFE has small energy dissipation (~0.3 eV). In addition, in order to pursue the ultimate diameter as much as possible, in recent years, atomic-scale electron sources with low work functions, that is, emission sites consisting of only one or several atoms, have become the research hot-spots.

In the process of implementing the concept of the present disclosure, the inventors found that the CFE in the prior art has at least the following problems. First, the stability of the CFE is often poor. The CFE needs to work in a very high vacuum ($10^{-9}$ to $10^{-8}$ Pa), which severely limits its scope of use. Even in this environment, it needs to be processed regularly to obtain a more stable operating state. Second, due to the impact of ion bombardment, the CFE is easier to burnout. Third, the aforementioned problems become more serious at larger emission currents. The current CFE generally has a total emission current of ~10 microamperes for stable operation for a long time, and the utilization rate is very low. In view of the aforementioned drawbacks, the Schottky thermal-field emission source is dominant in the field of high-brightness electron sources.

SUMMARY

One aspect of the present disclosure provides an electronic source operating method that enables the CFE to operate stably in a lower vacuum environment with a larger field emission current. The electron source to which the operating method applies may include at least one emission site fixed on a tip, the emission site being a reaction product formed by metal atoms of a surface of the tip and gas molecules under an electric field. Accordingly, the electron source operating method includes emitting electrons by controlling operating parameters of the electron source. The emission site is a reaction product formed by metal atoms fixed on the surface of the tip and gas molecules, that is, it is rooted on the surface of the tip, but not gas molecules or dissociative particles on the surface of the tip. Therefore, it will not cause over-current burnout due to the aggregation of the dissociative substances together to form a new emission site, so the stability is improved effectively. In addition, the emission site includes a reaction product formed by metal atoms of the surface of the tip and gas molecules, and is more stable than metal atoms or other metal compounds (such as metal borides) in the operating environment (where gas molecules exist). For example, it is more difficult to interact or react with hydrogen in the operating environment, which further improves the stability of the electron source. In addition, the emission site of the electron source provided in the present disclosure may be a reaction product formed by one or more metal atoms with gas molecules, that is, an atomic level electron source with a low work function may be formed. In addition, the surface work function is significantly reduced by the reaction product, and the emission capability is also significantly improved by the formation of the surface emission site cone. In addition, the current value of field emission current may be increased by increasing the number of emission sites. In this way, the CFE may be operated stably in low vacuum environment and has a large field emission current by controlling the operating parameters of the above electron sources.

Alternatively, the operating parameters of the electron source include an operating bias and any one or more of the following: an operating temperature or an operating pressure of an environment in which the electron source is located. In the operating process, the electron source in the present disclosure has different operating modes under different operating bias, operating temperature or operating pressure in the environment. By controlling the operating bias, operating temperature or operating pressure in the environment, the user requirement for the emission state may be realized.

Alternatively, the method may further include the following operations: performing heat treatment on the electron source before or after the electron source emits electrons; and/or performing heat treatment while the electron source emits electrons. The surface of the electron source may be kept clean and the emission efficiency may be improved by heat treatment.

Alternatively, the operating temperature is lower than a minimum value in a disappearance temperature of an electron source base, a disappearance temperature of metal atoms of the surface of the tip, and a disappearance temperature of the emission site, or the operating temperature is lower than a minimum value in a disappearance temperature of an electron source base, a disappearance temperature of metal atoms of the surface of the tip, a disappearance temperature of the emission site, and a disappearance temperature of a high field strength structure when the emission site is on the high field strength structure of the electron source base. This can effectively protect the emission site and/or the metal atomic layer where the emission site is located, and avoid the damage of the electron source caused by the high operating temperature.

Alternatively, the operating bias applied when the electron source emits electrons includes any one or more of the following: a continuous bias or a pulse bias. Specifically, a continuous bias or a pulse bias may be applied to the electronic source according to the user requirement.

Alternatively, the operating temperature is less than or equal to 1000 K, and the operating pressure is less than or equal to 10-3 Pa; or, the operating temperature is less than or equal to 150 K, and the operating pressure is less than or equal to 1E-6 Pa; or, the operating temperature is less than or equal to 800 K and greater than or equal to 500 K, and the operating pressure is less than or equal to 1E-6 Pa. The electron source provided in the present disclosure may be operated for a longer period of time at a lower vacuum. When the electron source is at a low temperature or in a higher operating temperature range, it may effectively delay the movement of dissociative substances (whether produced by ion bombardment or surface dissociation) to the emission area, and cooling of the tip may also improve the vacuum of the local area of the tip, which helps to extend the service life. When the electron source is in a higher operating temperature range, it may effectively avoid the formation of surface dissociates and improve the aggregation of dissociative substances and the problem of burnout, which helps to extend the service life of the electron source. The forming temperature of the emission site and the operating temperature are relatively low. Moreover, during operating, the structure of the electron source and the applied voltage value do not change, and the voltage value is stable. Therefore, the design of the electron gun is simpler.

Alternatively, performing heat treatment on the electron source before or after the electron source emits electrons includes any one or more of the following: a continuous heat treatment or a pulse heat treatment. The desorption of gas molecules adsorbed on the surface of the tip by heat treatment is helpful to improve the cleanliness of the surface of the tip, enhance the emission capability, and improve the condition that the dissociative substances are easy to gather to form emission site or even lead to burnout, thus extending the service life.

Alternatively, performing heat treatment while the electron source emits electrons includes any one or more of the following: a continuous heat treatment or a pulse heat treatment.

Alternatively, the continuous heat treatment may include the following operations. First, the electron source is continuously heated wherein the temperature of the heating is lower than a minimum value in a disappearance temperature of an electron source base, a disappearance temperature of metal atoms of the surface of the tip, and a disappearance temperature of the emission site, or the temperature of the heating is lower than a minimum value in a disappearance temperature of an electron source base, a disappearance temperature of metal atoms of the surface of the tip, a disappearance temperature of the emission site, and a disappearance temperature of a high field strength structure when the emission site is on the high field strength structure of the electron source base. Then, the temperature of the electron source is maintained for a first set time period. The first set time period means the time period set for continuous heat treatment. This can effectively protect the emission site, the metal atomic layer where the emission site is located and the high field strength structure, and avoid the damage of the electron source caused by the excessively high operating temperature.

Alternatively, in the process of the continuous heat treatment, the temperature of the electron source may be less than or equal to 800 K, and the first set time period may be less than or equal to 20 min.

Alternatively, the pulse heat treatment may include the following operations. The electron source is heated in a pulsed manner, wherein the pulse width is less than or equal to a pulse time period threshold, and an interval duration between pulse widths is greater than or equal to an interval duration threshold. Furthermore, the temperature of the heating is lower than a minimum value in a disappearance temperature of an electron source base, a disappearance temperature of metal atoms of the surface of the tip, and a disappearance temperature of the emission site, or the temperature of the heating is lower than a minimum value in a disappearance temperature of an electron source base, a disappearance temperature of metal atoms of the surface of the tip, a disappearance temperature of the emission site, and a disappearance temperature of a high field strength structure when the emission site is on the high field strength structure of the electron source base. This can effectively protect the emission site, the metal atomic layer where the emission site is located and the high field strength structure, and avoid the damage of the electron source caused by the high temperature.

Alternatively, the temperature of the electron source is less than or equal to 1000 K and greater than or equal to 500 K, the pulse time period threshold is less than or equal to 10 s, and the interval duration threshold is greater than or equal to 3 s; or the temperature of the electron source is less than or equal to 1000 K and greater than or equal to 800 K, the pulse time period threshold is less than or equal to 3 s and greater than or equal to 2 s, and the interval duration threshold is greater than or equal to 3 s.

Alternatively, the method may further include applying a bias to the electron source as an auxiliary during the continuous heat treatment or the pulse heat treatment, to effectively avoid the deformation of the tip, such as the high field strength structure.

Alternatively, applying a bias to the electron source as an auxiliary may include any one or more of the following: applying a positive bias as an auxiliary, applying a negative bias as an auxiliary, or applying a combination of a positive bias and a negative bias as an auxiliary.

Alternatively, when the positive bias is applied as an auxiliary, a value of the positive bias is less than a voltage value corresponding to a field evaporation of the emission site; or when the negative bias is applied as an auxiliary, a value of the negative bias is less than a voltage value corresponding to a first emission current threshold of the electron source. In this way, electron-excited degassing due to the significant field emission of the tip may be avoided, thus the bombardment of ionized gases may be at least partially avoid.

For example, in one implementation, the value of the positive bias is less than or equal to 2 KV and greater than or equal to 0.5 KV, or the value of the negative bias is less than or equal to –0.5 KV and greater than or equal to –1 KV.

Alternatively, the method may further include: performing a emission site repair on the electron source. Performing the emission site repair on the electron source may include the following operations: first, removing at least one emission site on the surface of the tip of the electron source, and then forming a new emission site on the surface of the tip, the new emission site being a reaction product formed by metal atoms of the surface of the tip and gas molecules under an electric field.

Alternatively, removing at least one emission site on the surface of the tip of the electron source may include the following operations: first, removing at least one emission site on the surface of the electron source by heating or field evaporation, wherein, when removing at least one emission site on the surface of the electron source by heating, a temperature of the heating is lower than a minimum value in a disappearance temperature of an electron source base and a disappearance temperature of metal atoms of the surface of the tip, or a temperature of the heating is lower than a minimum value in a disappearance temperature of an electron source base, a disappearance temperature of metal atoms of the surface of the tip, and a disappearance temperature of a high field strength structure when the emission site is on the high field strength structure of the electron source base. It should be noted that, during the heating process, the electron source may be applied with a bias as an auxiliary, and applying a bias to the electron source as an auxiliary includes any one or more of the following: applying a positive bias as an auxiliary, applying a negative bias as an auxiliary, or applying a combination of a positive bias and a negative bias as an auxiliary. In addition, when removing at least one emission site on the surface of the electron source by field evaporation, a value of a positive bias applied by the field evaporation is lower than a minimum value in a positive bias corresponding to disappearance of an electron source base and a positive bias corresponding to disappearance of metal atoms of the surface of the tip, or a value of a positive bias applied by the field evaporation is lower than a minimum value in a positive bias corresponding to disappearance of an electron source base, a positive bias corresponding to disappearance of metal atoms of the surface of the tip, and a positive bias corresponding to disappearance of a high field strength structure when the emission site is on the high field strength structure of the electron source base. This may avoid damage to metal atoms, the high field strength structure, the tip and so on below the emission site when the emission site is removed. When the emission site is removed, the metal atoms of the surface of the tip and gas molecules may then form a reaction product as an emission site.

Alternatively, the emission site is a hydrogen tungsten compound.

Alternatively, the base material is a electrically conductive material, or the high field strength structure material is a conductive material, or the surface of the base and/or the high field strength structure is metal atoms, or the high field strength structure material and the base material are the same or different, or the material of the metal atom on the surface of the base and/or the high field strength structure and the high field strength structure material are the same or different, when different, the metal atom on the surface of the base and/or the high field strength structure is formed by vapor deposition, electroplating or the like, or the material of the metal atom on the surface of the base and/or the high field strength structure and the base material are the same or different, when different, the metal atom on the surface of the base and/or the high field strength structure is formed by vapor deposition, electroplating or the like.

Alternatively, the base material is a conductive material and has a melting point of higher than 1000 K, or the high field strength structure material is a conductive material and has a melting point of higher than 1000 K, or the material of the metal atom on the surface of the base and/or the high field strength structure is a metal material with a melting point of higher than 1000 K, and the reaction product of the metal atoms and gas molecules includes the reaction product of the metal atoms whose melting point is higher than 1000 K and gas molecules under the vacuum condition.

The electron source operating method provided by the present disclosure enables the CFE to stably operate in a lower vacuum environment and have a larger field emission current, wherein the CFE may include at least one emission site fixed on a tip, the emission site being a reaction product formed by metal atoms of the surface of the tip and gas molecules under an electric field.

BRIEF DESCRIPTION OF THE DRAWINGS

For a more complete understanding of the present disclosure and its advantages, reference is now made to the following descriptions in connection with the accompanying drawings, in which.

DETAILED DESCRIPTION

Figure 1:
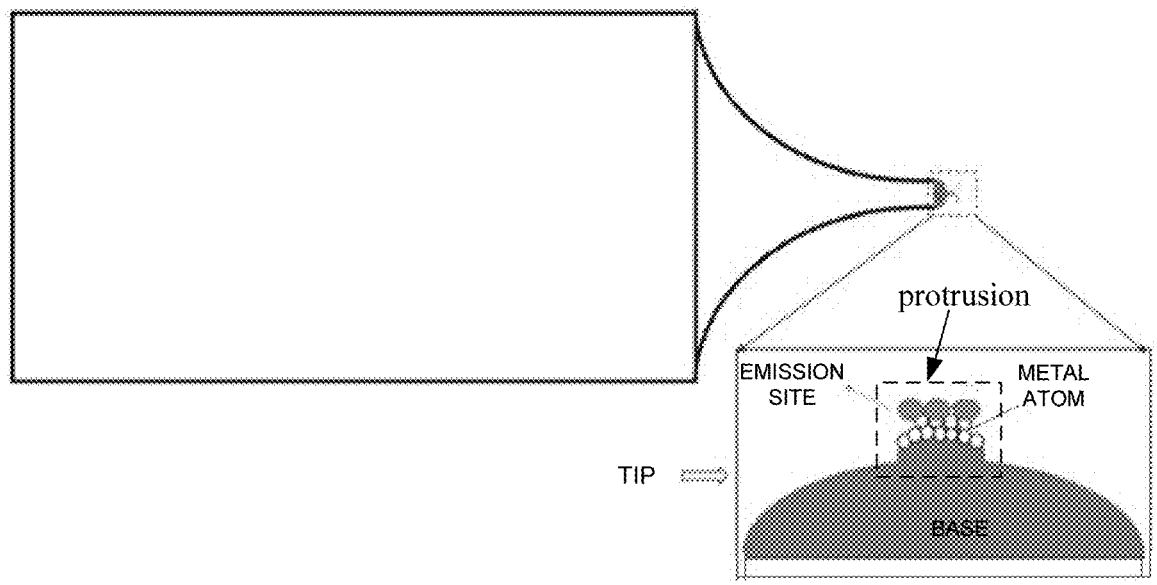
FIG. 1 schematically illustrates a schematic structural view of an electron source according to an embodiment of the present disclosure.

Hereinafter, the embodiments of the present disclosure will be described with reference to the accompanying drawings. It should be understood, however, that these descriptions are merely exemplary and are not intended to limit the scope of the present disclosure. In the following detailed descriptions, for ease of interpretation, numerous specific details are set forth to provide a comprehensive understanding of the embodiments of the present disclosure. However, it is apparent that one or more embodiments may be practiced without these specific details. In addition, in the following description, descriptions of well-known structures and techniques are omitted to avoid unnecessarily obscuring the concepts of the present disclosure.

The terminology used herein is for the purpose of describing particular embodiments only and is not intended to be limiting of the disclosure. The terms "include", "comprise", etc., as used herein indicate the presence of stated features, steps, operations, and/or components, but do not preclude the presence or addition of one or more other features, steps, operations, or structures.

All terms (including technical and scientific terms) used herein have the meaning as commonly understood by one of ordinary skill in the art, unless otherwise defined. It should be noted that terms used herein should be interpreted as having a meaning that is consistent with the context of the present description and should not be interpreted in an idealized or overly stereotypical manner.

In the case of a statement similar to "at least one of A, B, and C, etc.," it should be generally interpreted in the light of the ordinary understanding of the expression by a person skilled in the art (for example, "a system having at least one of A, B, and C" shall include, but is not limited to, systems with A alone, B alone, C alone, A and B, A and C, B and C, and/or A, B, and C, etc.). In the case of a statement similar to "at least one of A, B, or C, etc.," it should be generally interpreted in the light of the ordinary understanding of the expression by a person skilled in the art (for example, "a system having at least one of A, B, or C" shall include, but is not limited to, systems with A alone, B alone, C alone, A and B, A and C, B and C, and/or A, B, and C, etc.).

Several block diagrams and/or flow charts are shown in the drawings. It should be understood that some of the blocks or combinations thereof in the block diagrams and/or flow charts may be implemented by computer program instructions. Such computer program instructions may be provided to a processor of a general purpose computer, a special purpose computer, or other programmable data processing apparatus such that the instructions, when executed by the processor, may create means for implementing the functions/operations illustrated in these block diagrams and/or flow charts.

The field emission behavior in the prior art is first described below in order to better understand the technical solutions of the present disclosure.

An electron source in the prior art, such as a tungsten (310) single crystal tip electron source, undergoes the following three stages during use. First, it is a clean electron source and enters the stability period as the gas is adsorbed. However, with the further adsorption of gas, current noise gradually appears, the electron source enters the instability period, and the stability is deteriorated. As the operating time increases, contaminants appear gradually on the surface of the electron source, and the emission current begins to fluctuate violently, which finally results in the burnout of the electron source.

Regarding the above burnout, the inventors further studied that it is closely related to ion bombardment. This is due to the fact that the electrons, after being emitted, will ionize the gas molecules in the surrounding space and then bombard the tip. One possibility is that the surface of the tip is bombarded to form a plurality of protrusions, and the protrusions serve as emission sites respectively, and finally cause excessive current and burnout. There is also a mechanism in which gas molecules adsorbed to the surface of the tip or combinations of the gas molecules and other substances are continuously moved by an electric field, and finally aggregate into a nanometer-scale protrusion at a defect point on the surface (such as that generated by ion bombardment) as an emission site. The rapid growth of the emission site causes an overcurrent, which eventually leads to the burnout of the tip.

Further, the aforementioned problems become more serious at larger emission currents. Generally, the total emission current for stable operation for a long time is ~10 microamperes, and the utilization rate is very low. In view of the aforementioned drawbacks, the Schottky thermal-field emission source is dominant in the field of high-brightness electron sources.

Essentially, for the CFE, no material can avoid the effects of gas adsorption and ion bombardment. However, if operating at large current (>10 microamperes), the electrons will excite degassing (especially when electron bombarding extraction electrode) and further degrade the vacuum. As a result, the tip emission stability is very poor, the amplitude of fluctuation is very large, and it is more difficult to work stably for a long time. Therefore, how to provide a stable and large field emission current has been the most important challenge in the development of cold field emission electron sources.

In order to avoid the above effects of gas adsorption and ion bombardment, the current field emission electron source (generally referred to as metal tip) can only work in ultra-high vacuum ($<10^{-8}$ Pa), which severely restricts the scope of application of the CFE. The inventors conducted further in-depth research on this and found the following characteristics. The residual gases in vacuum are $H_2$, CO, $CO_2$, and the main component is $H_2$. The adsorption of $H_2$ causes the emission ability of the clean surface to gradually deteriorate. It can be said that in the vacuum range, the influence of $H_2$ fundamentally determines the field emission performance of the tip. Therefore, how to deal with the influence of $H_2$ becomes the key to achieving a high stability tip. There are also some technical solutions in the prior art that can alleviate the problem of gas adsorption, for example, by further increasing the vacuum of the chamber to a magnitude of $1 \times 10^{-9}$ Pa.

In addition, there are some technical solutions which directly use some dissociative particles (atomic clusters) on the tip surface as the emission site, which is also an attempt to solve the problem. These free particles may be contaminants formed by prolonged placement under poor vacuum, and the electric field acts to move these free particles somewhere to the tip. For this kind of emission site, the emission angle is very small (~5°), the extraction voltage is extremely low, and the brightness can reach 10 times or more of the conventional W (310). Although it cannot form a large emission current (generally steadily giving ~10 nA), it exhibits excellent stability (<1×10$^{-7}$ Pa). One possible inference is that very small beam angles and emission areas can effectively reduce the effects of ion bombardment. However, as mentioned above, this kind of dissociative particle is not fixed, and the inventors have found that when the current is large (>1 uA), the electron source is easily burned out. Furthermore, in the course of work, this kind of substance will appear continuously and gradually change its emission state, which is difficult to maintain for a long time. Another problem is that when exposed to the atmosphere, since this kind of substance has a size comparable to that of the gas molecules, it is highly susceptible to gas interference.

Based on the above various analysis, reasoning and experiments, the inventors have provided the electron source operating method of the present disclosure to realize long-term stable operation of the electron source, which can provide a large field emission current, and can work in a poor vacuum environment.

Embodiments of the present disclosure provide an electron source operating method, which may be applied to an electron source. The electron source may include at least one emission site fixed on a tip, the emission site being a reaction product formed by metal atoms of a surface of the tip and gas molecules under an electric field. The method includes emitting electrons by controlling operating parameters of the electron source. The electron source has the following advantages. First, the emission site is directly generated by the reaction of gas molecules and surface metal atoms in a strong field, so it is rooted on the surface of the tip, and does not move on the surface. Secondly, the emission site itself has a strong environmental adaptability and can operate under poor vacuum (<10$^{-5}$ Pa). Thirdly, the emission site has a typical field emission behavior, the extraction voltage is extremely low, about 30% lower than the conventional tip, and the maximum emission current is up to 10 mA. However, the following problems still exist in the process of using the electron source. It is susceptible to gas adsorption, and as the gas molecules are continuously adsorbed on the surface of the electron source, for example, the emission site may be covered by the gas molecules, resulting in a decrease in emission capability. In addition, it is easily affected by ion bombardment. For example, the electrons, after being emitted, will ionize the gas molecules in the surrounding space. The ionized ions will bombard the surface of the tip. A mechanism is that the surface of the tip will be bombarded to form a protrusion (the protrusion will act as a new emission site which emits current). The surface of the tip is bombarded to form a plurality of protrusions, and the plurality of protrusions respectively serve as emission sites, and finally cause excessive current to burn out the electron source. Another mechanism is that gas molecules adsorbed to the surface of the tip or combinations of the gas molecules and other substances are continuously moved by an electric field, and finally aggregate into a nanometer-scale protrusion at a defect point on the surface (such as that generated by ion bombardment) as an emission site. The rapid growth of the emission site formed by the nanometer-scale protrusion causes an overcurrent, which eventually leads to the burnout of the tip. In addition, it may be affected by surface dissociation. For example, when the tip is operating or placed for a long time, some dissociation will occur on the surface, that is, some movable atomic-scale particles may be generated. These substances may converge at certain positions. Although these movable atomic-scale particles have high brightness, they are difficult to withstand large emission currents (such as 1 microampere), and are prone to sudden burnout of the tip, which is similar to ion bombardment. The method provided by the present disclosure is capable of controlling the operation of the electron source as described above, and further provides some technical solutions to solve the problems as described above.

FIG. 1 schematically shows a schematic structural view of an electron source according to an embodiment of the present disclosure.

As shown in FIG. 1, the tip may include one or more emission sites that are fixed on the surface of the tip, and the emission site may be the reaction product of metal atoms on the surface of the tip with gas molecules.

In one embodiment, the formation of the reaction products of the metal atoms on the surface of the tip and the gas molecules by applying an electric field may be implemented in a variety of ways. For example, a voltage may be directly applied to the tip to form high field strength on the surface of the tip, which causes the metal atoms on the surface of the tip to react with the surrounding gas molecules to form the reaction products. Alternatively, a voltage may be applied to a field strength generating structure (such as an electrode) near the tip to form an electric field, thereby forming a high field strength on the surface of the tip, and causing the metal atoms on the surface of the tip to react with the surrounding gas molecules to form the reaction products. In short, the field formed on the surface of the tip and the manner in which the field is formed are not limited, as long as a field (such as an electric field) capable of causing the metal atoms on the surface of the tip to react with the surrounding gas molecules to form reaction products can be formed on the surface of the tip.

In an embodiment in which a field is formed by applying a voltage to a tip, in an illustrative example, the electric field is generated by applying a positive bias, a negative bias, or a combination of a positive bias and a negative bias to the tip. When a positive bias is applied, the field strength of the electric field includes 1 to 50 V/nm, and when a negative bias is applied, the field strength of the electric field includes 1 to 30 V/nm.

The emission site may be formed at a specified position of the tip, for example, within a certain range where the tip axis intersects the surface of the tip. Alternatively, the emission site may be formed on a specific structure, for example, a protrusion which has a field strength advantage to preferentially form a reaction product of metal atoms and gas molecules. Alternatively, the emission site may be formed in a specific reactive region, for example, a specific metal atom region which is more likely to react with gas molecules. Of course, the above two cases may also be used in combination, which is not limited here. In a specific example, the tip structure comprises a base and one or more high field strength structures on the base having a higher field strength than that of other portions of the base, and an outer surface of at least one of the high field strength structures comprises metal atoms. The metal atoms on the surface of the high field strength structure are more likely to react with the gas molecules to form a reaction product in the same environment by virtue of the field strength advantage, so as to preferentially generate the emission site on the high field strength structure. In another specific example, the tip structure comprises a base and one or more active regions on the base having a larger reaction activity than that of other portions of the base, and an outer surface of at least one of the active regions comprises metal atoms. The metal atoms on the surface of the active region are more likely to react with the gas molecules to form a reaction product in the same environment by virtue of the activity advantage, so as to preferentially generate the emission site at the active region. According to an embodiment of the present disclosure, the high strength structure comprises a protrusion.

The metal atom may be a metal atom on the surface of the tip body, that is, the type of the metal atom is the same as the type of the tip body. Alternatively, the metal atom may be a different kind of metal atom formed on the surface of the tip by vapor deposition, electroplating or the like. Preferably, the material of the metal atom has a melting point of more than 1000 K, so it is more stable and allows to clean the tip by using the heat treatment techniques described above. For example, the metal material having a melting point higher than 1000 K may include any one or more of the following: tungsten, iridium, tantalum, molybdenum, niobium, hafnium, chromium, vanadium, zirconium, titanium, rhenium, palladium, platinum, rhodium, osmium, ruthenium, gold or hexaboride metal, and the like. For example, one of the metal atoms mentioned above may act alone as the metal atom on the surface of the tip, or a laminate formed of some of the metal atoms mentioned above, such as a laminate of a titanium layer, a platinum layer, and a tungsten layer, may act as the metal atom on the surface of the tip, or a non-monolithic metal layer formed by mixing some of the metal atoms mentioned above may act as the metal atom on the surface of the tip, which is not limited herein.

The gas molecules may be specific gas molecules introduced by a gas introduction device (for example, a gas flow valve), gas molecules resulting from desorption from the surface of a certain component, or residual gas molecules in the vacuum chamber, and the like. Of course, the gas molecules may also be a combination of two of the above gas molecules, which is not limited herein. The gas molecules include hydrogen-containing gas molecules, and any one or more of the following gas molecules: nitrogen-containing gas molecules, carbon-containing gas molecules, or oxygen-containing gas molecules. The gas molecules may be introduced gas molecules, and therefore, the gas introduction amount may be dynamically adjusted, and generally, when the gas is introduced, the degree of vacuum is less than $10^{-4}$ Pa. When the residual gas in the vacuum chamber is directly utilized, the main residual gas in the vacuum chamber is hydrogen. Preferably, the hydrogen-containing gas molecules comprise hydrogen molecules.

It should be noted that the emission site will disappear at certain temperature, and the disappearance temperature, such as the decomposition temperature, of the emission site may be lower than the temperature at which the tip body disappears in order to remove the emission site, and the disappearance temperature of the emission site may be higher than the operating temperature and the temperature at which the adsorbed gas molecules are desorbed, such that it is convenient to recover the electron source to a stable state by a simple desorption treatment such as heat treatment.

The electron source operating method includes emitting electrons by controlling operating parameters of the electron source. For example, by controlling the operating voltage of the electron source, the duration of the applied voltage, the heating current, the duration of the heating current, the operating temperature, the ambient vacuum, and the like, the electron source is operated in a mode desired by the user, for example, the electron emission operating mode (with the emission current controllable), the heat treatment mode, the repair mode, and the like, as described below. The electron source provided by the present disclosure can stably operate in a lower vacuum environment and have a larger field emission current by the above electron source operating method, wherein the electron source includes at least one emission site fixed on a tip, the emission site being a reaction product formed by metal atoms of the surface of the tip and gas molecules under an electric field.

Specifically, the operating temperature should be lower than a minimum value in a disappearance temperature of an electron source base, a disappearance temperature of metal atoms of the surface of the tip, and a disappearance temperature of the emission site, or the operating temperature is lower than a minimum value in a disappearance temperature of an electron source base, a disappearance temperature of metal atoms of the surface of the tip, a disappearance temperature of the emission site, and a disappearance temperature of a high field strength structure when the emission site is on the high field strength structure of the electron source base.

The operating bias applied when the electron source emits electrons includes any one or more of the following: a continuous bias or a pulse bias. The method of applying the bias voltage is not limited, so that the user's various requirements for the electron source can be satisfied.

Figure 2:
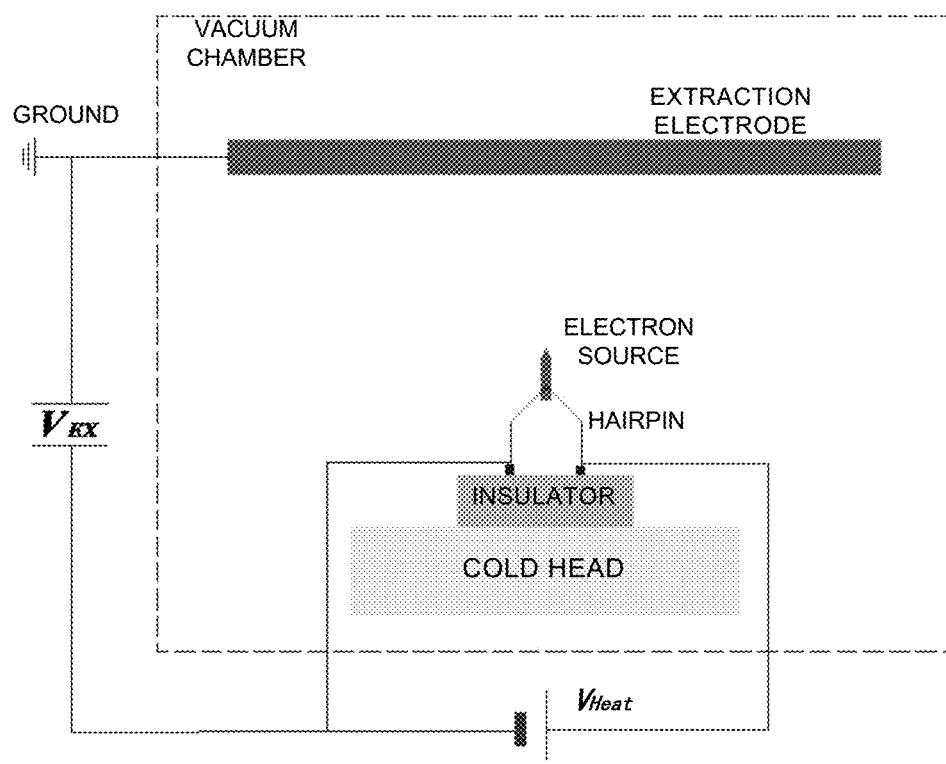
FIG. 2 schematically illustrates a schematic structural view of a device suitable for the electron source operating method according to an embodiment of the present disclosure.

FIG. 2 schematically illustrates a schematic structural view of a device suitable for the electron source operating method according to an embodiment of the present disclosure.

As shown in FIG. 2, the device may include a high voltage power supply $V_{EX}$, a DC power supply $V_{Heat}$, an extraction electrode, a vacuum chamber, a cold head, an insulator, a hairpin, an electron source, a gas introduction device (not shown), and a heating device (not shown).

The electron source (such as a tip having on the surface reaction products formed by tungsten atoms and hydrogen molecules as emission sites) is welded on the hairpin and placed in the vacuum chamber, and the background vacuum is better than $10^{-3}$ Pa (preferably better than $10^{-6}$ Pa).

A DC power supply ($V_{Heat}$, ~5 A@5V) is externally connected to the electron source. Therefore, heat treatment may be performed on the tip. The heat treatment includes a continuous heating mode, a pulse heating mode, and the like. Through the above heating method, the maximum temperature of the tip can reach 3000 degrees or more, that is, the temperature range can be adjusted from room temperature to 3000 degrees. It should be noted that the way the tip is heated may be through thermal radiation, etc., where the heating mode is not limited herein.

There is an extraction electrode at the front of the electron source, and the extraction electrode is grounded, and the extraction electrode itself may be a conductive phosphor screen or an all-metal structure. The electron source is connected to the high voltage power supply $V_{EX}$ (±30 kV), so that an electric field may be applied to the electron source. When $V_{EX}$ is negative, it may be used for field emission; when $V_{EX}$ is positive, it may be used for a surface treatment such as field evaporation. It should be noted that the method of applying an electric field to the tip may also be that the electron source is grounded, and the high voltage power supply is connected to the extraction electrode, and the method of applying the electric field is not limited herein.

An electric field may be applied during the heat treatment, and the heat treatment may be applied simultaneously with the electric field or may be applied asynchronously.

The electron source is placed on an insulator sample holder and connected to the cold head. There is also a heating device on the insulator stage, and the adjustable temperature range is 10 to 500 K.

The relationship between the operating state of the electron source and the operating parameters after applying the operating voltage to the electron source will be described below with reference to FIGS. 3A to 3E. The operating parameters of the electron source include a operating bias and any one or more of the following: an operating temperature or an operating pressure of an environment in which the electron source is located.

Figure 3A:
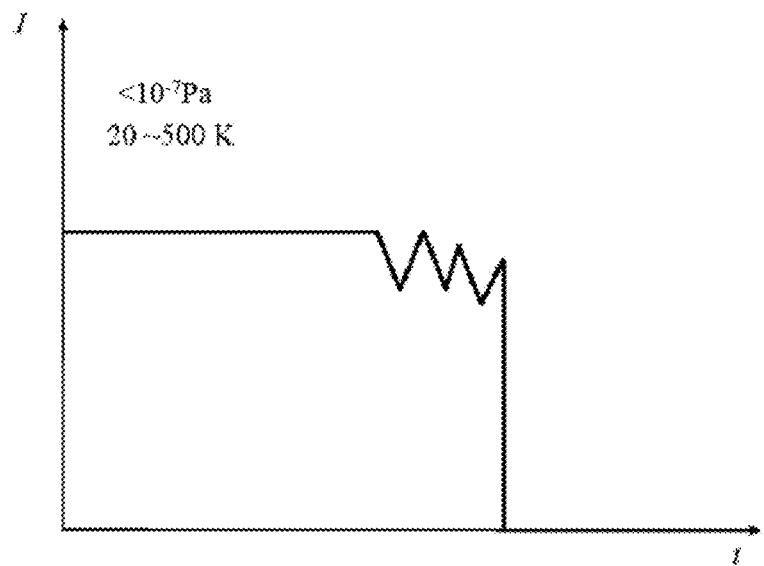
FIG. 3A schematically illustrates a schematic diagram of current emission capability of an electron source at low temperatures or room temperature in a high vacuum environment, in accordance with an embodiment of the present disclosure.

FIG. 3A schematically illustrates a schematic diagram of emission current capability of an electron source at low temperatures or room temperature in a high vacuum environment, in accordance with an embodiment of the present disclosure.

As shown in FIG. 3A, the electron source is stabilized for a certain period of time and then burned out. The low temperatures or room temperature may be 20 to 500 K, and the high vacuum may be about $10^{-8}$ Pa. The electron source provided by the present disclosure exhibits a typical field emission behavior, that is, its emission current increases significantly as the extraction voltage increases. FIG. 3A shows typical test results for vacuum degrees on the order of $10^{-8}$ Pa. The applied voltage is still a constant negative high voltage (~-2 kV). At the initial stage, the emission current is relatively stable. After a period of time, the emission current is somewhat unstable, and after a while, there will be a emission pattern mutation or burnout. This behavior can be observed at temperatures between 20 and 500 K. The difference is that the duration of the process at low temperatures (<150 K) increases significantly.

Figure 3B:
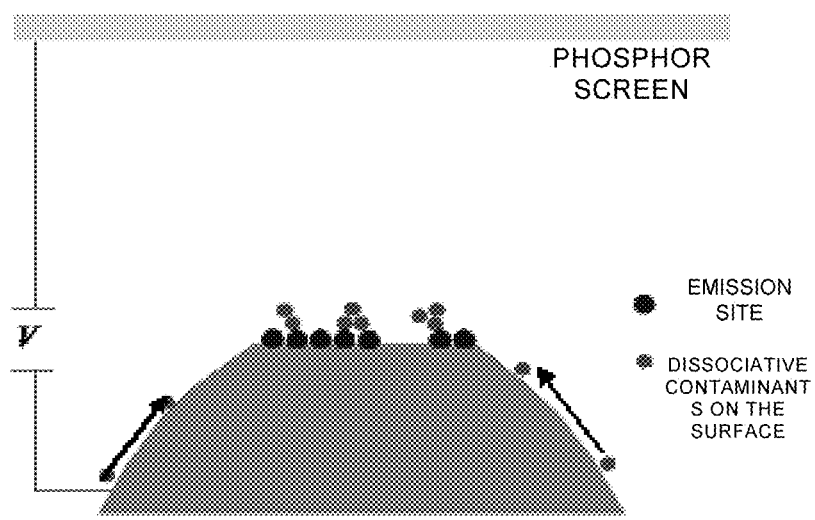
FIG. 3B schematically illustrates a schematic diagram of an electron source burnout process at low temperatures or room temperature in a high vacuum environment, in accordance with an embodiment of the present disclosure.

FIG. 3B schematically illustrates a schematic diagram of an electron source burnout process at low temperatures or room temperature in a high vacuum environment, in accordance with an embodiment of the present disclosure.

The above burnout may be due to the presence of dissociative contaminants on the surface of the tip, and FIG. 3B shows the corresponding schematic diagram. The dissociative contaminants may be produced by two mechanisms: one based on surface dissociation and one based on ion bombardment during field emission. As shown in FIG. 3B, the dissociative substances are not fixed, and move to places with high field strength under the action of an external electric field, and finally accumulate to some areas. The deposited dissociative substance emits electrons even at very low extraction voltages. According to a large number of experiments, this kind of deposit can only give a small emission current when the emission is stable; when the emission current is large (such as >1 uA), the fluctuation is large, and the electron source is easily burned out.

Figure 3C:
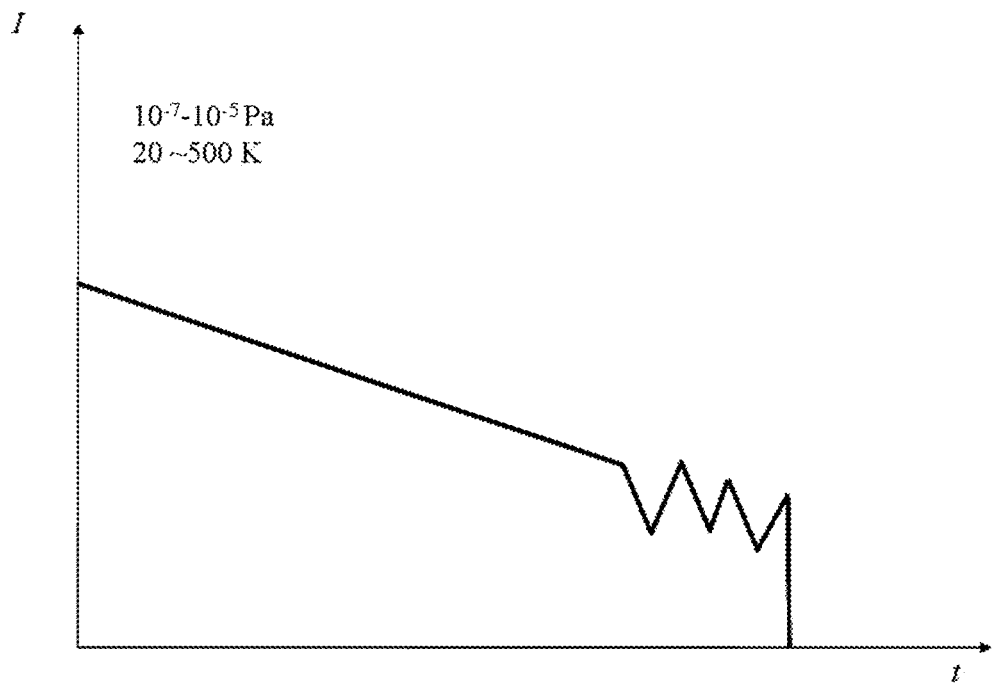
FIG. 3C schematically illustrates a schematic diagram of current emission capability of an electron source at low temperatures or room temperature in a medium vacuum environment, in accordance with an embodiment of the present disclosure.

FIG. 3C schematically illustrates a schematic diagram of current emission capability of an electron source at low temperatures or room temperature in a medium vacuum environment, in accordance with an embodiment of the present disclosure.

As shown in FIG. 3C, the emission current of the electron source decreases significantly with the increase of the operating time. After a period of time, the emission current becomes unstable, and after a while, the burnout phenomenon occurs. The low temperature or room temperature may be 20 to 500 K, and the medium vacuum may be about $10^{-7}$ to $10^{-5}$ Pa. FIG. 3C shows typical test results of the tip under medium vacuum ($10^{-7}$ to $10^{-5}$ Pa), and the applied voltage is still a constant negative high voltage (~-2 kV). The current decreases obviously with time. After a period of time, the emission current is somewhat unstable, and after a while, it will burn out. This behavior can be observed at room temperature as well as at low temperatures. The difference is that the duration of the process at low temperatures (<150 K) increases significantly. At the same time, at low temperatures, the slope SL (the slope of degradation) of the current drop decreases significantly and tends to level. The burnout was attributed to the effects of ion bombardment and surface dissociation. The current drop can basically be attributed to the effect of gas adsorption.

Figure 3D:
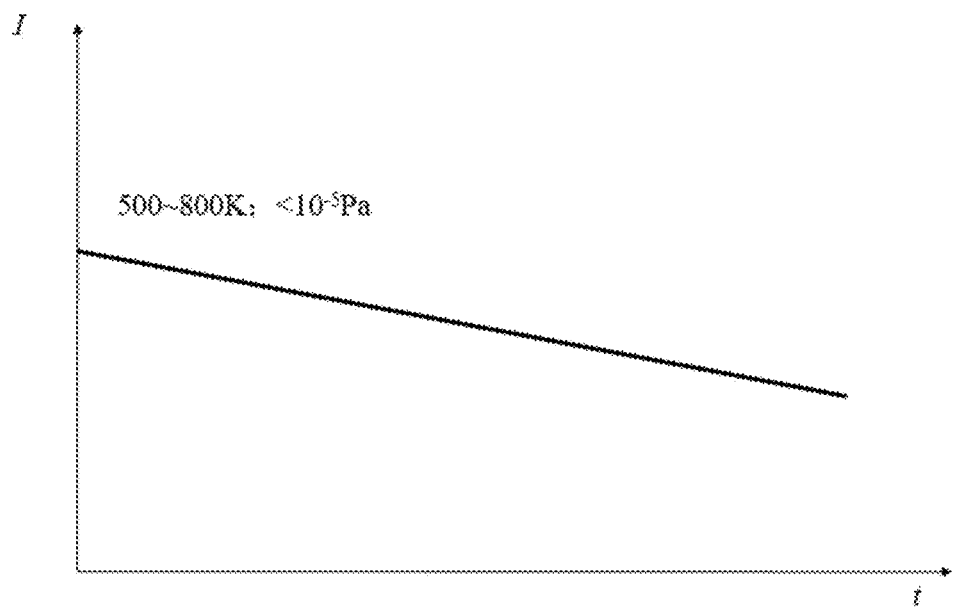
FIG. 3D schematically illustrates a schematic diagram of current emission capability of an electron source at high temperatures in a vacuum environment, in accordance with an embodiment of the present disclosure.

FIG. 3D schematically illustrates a schematic diagram of current emission capability of an electron source at high temperatures in a vacuum environment, in accordance with an embodiment of the present disclosure.

As shown in FIG. 3D, the electron source exhibits distinct field emission behavior at higher operating temperatures (for example, 500 to 800 K). Specifically, the emission current of the electron source decreased significantly with the increase of the operating time, but no burnout phenomenon occurred. The high temperatures may be 500 to 800K, and the medium vacuum may be about $10^{-5}$ Pa. FIG. 3D shows typical test results at high temperatures in a certain vacuum range (<$10^{-5}$ Pa), and the applied voltage is still a constant negative high voltage (~-2 kV). The current decreases with time, but the slope of the drop (SL, the slope of degradation) is significantly smaller than that of the tip tested at room temperature (~300 K). The slope is closely related to the degree of vacuum, so the current drop can be attributed to the effect of gas adsorption. Interestingly, there is no longer a burnout. However, when the degree of vacuum is further lowered, even at a high temperature, the tip still exhibits burnout behavior, and the result is very similar to that of FIGS. 3A and 3C. The burnout can still be attributed to the effects of ion bombardment and surface dissociation.

That is to say, the decline in emission capacity and tip burnout restrict the use of electron sources as described above.

In order to enable the above-mentioned electron source to achieve a stable operating state in an environment with a lower degree of vacuum so that the electron source can be easily promoted and applied, the above experimental results are analyzed.

Figure 3E:
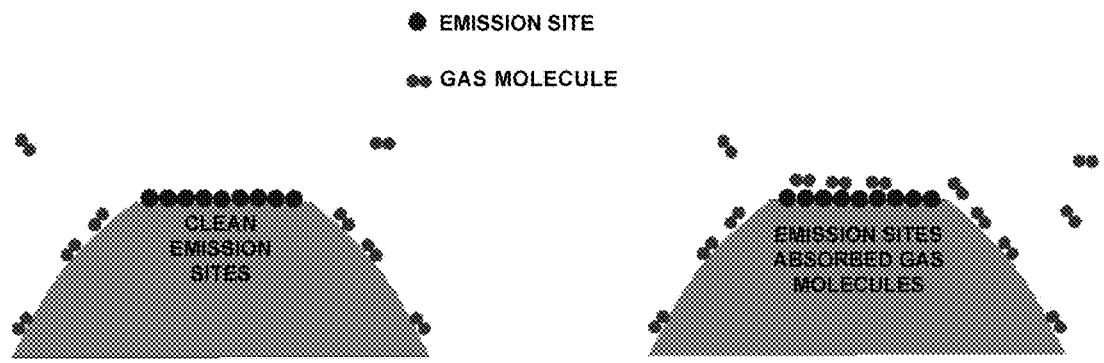
FIG. 3E schematically illustrates a schematic view of adsorbing gas molecules on a tip surface in accordance with an embodiment of the present disclosure.

FIG. 3E schematically illustrates a schematic view of adsorbing gas molecules on a tip surface in accordance with an embodiment of the present disclosure.

As shown in FIG. 3E, in the left figure, the surface of the emission sites is a clean surface. During the operating process, the gas molecules adsorbed on the surface of the tip gradually move toward the emission sites under the action of the electric field (when the emission sites are formed on the surface of a high field strength structure, the field strength at the emission sites is the highest), so that the emission ability of the electron source is lowered gradually or even disappear. According to the analysis, under a certain operating voltage, the operating state of the electron source is mainly related to the degree of vacuum and the operating temperature.

The effect of the degree of vacuum is as follows: the degree of vacuum is directly related to the emission capability of the electron source. The better the degree of vacuum, the better the stability, and the longer the continuous operating time, so the emission capability is likely to decline or degrade.

The effect of the operating temperature is as follows: at the appropriate operating temperature, the slope SL of the emission current drop is significantly reduced, that is, the duration of continuous operation may be extended. This is reflected in two aspects. In the first aspect, the operating time may be greatly extended when operating at low temperatures (for example, <150 K, relative to the room temperature of 300 K). In the second aspect, the operating time may be greatly extended when operating at higher temperatures (>500 K, relative to the room temperature of 300 K).

In summary, in one embodiment, the electron source may operate in an environment where the operating temperature is less than or equal to 1000 K and the operating pressure is less than or equal to $10^{-3}$ Pa.

In order to further extend the service life of the electron source, preferably, the electron source may be operated in an environment where: the operating temperature is less than or equal to 150K, and the operating pressure is less than or equal to $1E^{-6}$ Pa; or, the operating temperature is less than or equal to 800 K and greater than or equal to 500 K, and the operating pressure is less than or equal to $1E^{-6}$ Pa.

In addition, it can be seen from the above analysis that although gas adsorption is not fatal, it is ubiquitous in the emission process, and can lead to a decline in emission capacity. In order to improve the above gas adsorption problem, according to the analysis, the emission capacity of the electron source may be recovered by separating the adsorbed gas molecules from the surface of the electron source. Specifically, desorption treatment may be performed by heating after a certain period of operation (for example, 0.1 to 10 hours). The higher the temperature, the more adequate the treatment. However, since the emission site provided by the present disclosure is a reaction product formed by metal atoms on the surface of the tip and gas molecules, the emission site will disappear when treated at high temperature for a long time, for example, the reaction product may decompose. In addition, since the emission sites are formed on the nanometer or sub-nanometer-like protrusions, these protrusions are also gradually deformed at high temperatures, which will lead to a decrease in emission capability, that is, a higher operating voltage is required. Accordingly, the present disclosure provides a related heat treatment method suitable for the above electron source.

In one embodiment, the method may also include the following operations. First, heat treatment is performed on the electron source before or after the electron source emits electrons, and/or heat treatment is performed while the electron source emits electrons.

Performing heat treatment on the electron source before or after the electron source emits electrons includes any one or more of the following: a continuous heat treatment or a pulse heat treatment. That is to say, in a state where the electron source is not emitting electrons, it may be subjected to continuous heating treatment or pulse heating treatment.

Performing heat treatment while the electron source emits electrons includes any one or more of the following: a continuous heat treatment or a pulse heat treatment. That is to say, in the state in which the electron source is emitting electrons, it is also possible to perform continuous heating treatment or pulse heating treatment.

In a specific embodiment, the continuous heat treatment may include the following operations. First, the electron source is continuously heated (for example, heating the electron source with electricity, or heating by, for example, thermal radiation, the heating method is not limited herein) wherein the temperature of the heating is lower than a minimum value in a disappearance temperature of an electron source base, a disappearance temperature of metal atoms of the surface of the tip, and a disappearance temperature of the emission site, or the temperature of the heating is lower than a minimum value in a disappearance temperature of an electron source base, a disappearance temperature of metal atoms of the surface of the tip, a disappearance temperature of the emission site, and a disappearance temperature of a high field strength structure when the emission site is on the high field strength structure of the electron source base. Then, the temperature of the electron source is maintained for a first set time period $t_c$. Preferably, in the case of using a reaction product of tungsten atoms and gas molecules as an emission site, the heating temperature of the electron source may be less than or equal to 800 K, and the first set time period may be less than or equal to 20 min.

The limitation of the heating temperature may effectively prevent the emission site, the metal atoms on the surface of the tip, the high field strength structure or the tip body from being damaged. The first set time period may be determined according to actual use effects, and the first set time period is also related to the material type of the metal atoms on the surface of the tip, the material type of the high field strength structure, and the like. For example, when the material type of the metal atoms on the surface of the tip and the material type of the high field strength structure have higher melting points, the metal atoms on the surface of the tip and the high field strength structure are less susceptible to heat treatment, as long as the heat treatment does not cause the emission site to disappear.

It should be noted that during the heat treatment, for example, during the continuous heat treatment, the tip may be applied with a bias voltage as an auxiliary to avoid the change of emission capacity due to the deformation of the tip structure (such as the high field strength structure).

Applying a bias to the electron source as an auxiliary includes any one or more of the following: applying a positive bias as an auxiliary, applying a negative bias as an auxiliary, or applying a combination of a positive bias and a negative bias as an auxiliary.

Specifically, when the positive bias is applied as an auxiliary, a value of the positive bias is less than a voltage value corresponding to a field evaporation of the emission site; or when the negative bias is applied as an auxiliary, a value of the negative bias is less than a voltage value corresponding to a first emission current threshold of the electron source (so that, for example, no emission current is generated or excessive emission current is not generated).

Figure 4A:
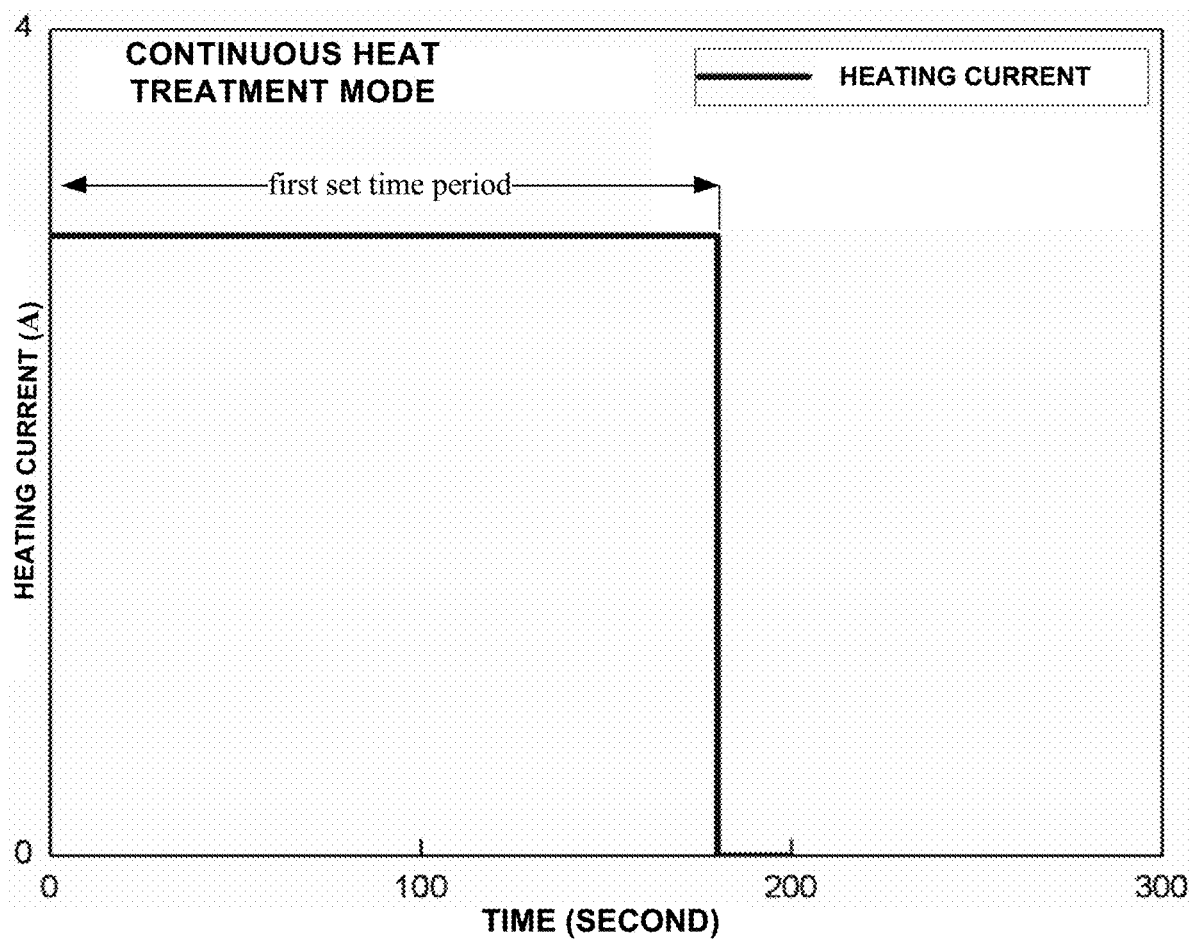
FIG. 4A schematically shows a schematic diagram of a continuous heat treatment mode in accordance with an embodiment of the present disclosure.

FIG. 4A schematically shows a schematic diagram of a continuous heat treatment mode at a medium temperature in accordance with an embodiment of the present disclosure.

As shown in FIG. 4A, in the continuous heat treatment mode, the heating temperature may be less than ~800 K. The tip is heated in a temperature range of less than ~800 K, for example, by passing a current through the hairpin (the current value may be about several amperes (A)). The device may refer to the device shown in FIG. 2. This process usually lasts for a few minutes (for example, 0.1 to 20 min), and may also be extended depending on the tip condition.

Further, in the above-mentioned continuous heating operation, it is still possible to cause damage to the protrusions of the tip. In particular, the cumulative effect of long-term treatment eventually leads to deformation of the protrusions of the tip, resulting in a significant drop in the emission capability. During the experiment, it was discovered by comparing the experimental results, that the tip deformation may be effectively avoided by applying a certain degree of bias (voltage) to the tip during heat treatment. There are two modes here. The first mode is to apply a positive bias (for example, its typical value may be 0.5 to 2 kV). Because there is no field emission current, it may prevent the electron-excited desorption gas from continuing to adsorb to the tip, but the absolute value of the maximum voltage when applying a positive bias should be less than the field evaporation voltage of the emission site on the surface of the tip. The second mode is to apply a negative bias. The voltage range should be controlled so that the field emission of the tip is not significant, otherwise, the emitted electrons will excite the gas, which in turn causes the adsorption to continue. Specifically, the typical value of the negative bias applied may be −0.5 to −1 kV.

In another specific embodiment, the pulse heat treatment may include the following operations. First, the electron source is heated in a pulsed manner, wherein the pulse width $t_1$ is less than or equal to a pulse time period threshold, and an interval duration between pulse widths $t_2$ is greater than or equal to an interval duration threshold. Specifically, the temperature of the heating is lower than a minimum value in a disappearance temperature of an electron source base, a disappearance temperature of metal atoms of the surface of the tip, and a disappearance temperature of the emission site, or the temperature of the heating is lower than a minimum value in a disappearance temperature of an electron source base, a disappearance temperature of metal atoms of the surface of the tip, a disappearance temperature of the emission site, and a disappearance temperature of a high field strength structure when the emission site is on the high field strength structure of the electron source base.

For example, the temperature of the electron source is less than or equal to 1000 K and greater than or equal to 500 K, the pulse time period threshold is less than or equal to 10 s, and the interval duration threshold is greater than or equal to 3 s; or the temperature of the electron source is less than or equal to 1000 K and greater than or equal to 800 K, the pulse time period threshold is less than or equal to 3 s and greater than or equal to 2 s, and the interval duration threshold is greater than or equal to 3 s.

Further, as in the continuous heating mode the electron source may be applied a bias as an auxiliary, the electron source may also be applied a bias as an auxiliary in the pulse heat treatment.

Specifically, applying a bias to the electron source as an auxiliary includes any one or more of the following: applying a positive bias as an auxiliary, applying a negative bias as an auxiliary, or applying a combination of a positive bias and a negative bias as an auxiliary. When the positive bias is applied as an auxiliary, a value of the positive bias is less than a voltage value corresponding to a field evaporation of the emission site; or when the negative bias is applied as an auxiliary, a value of the negative bias is less than a voltage value corresponding to a first emission current threshold of the electron source. For example, the value of the positive bias is less than or equal to 2 KV and greater than or equal to 0.5 KV, or the value of the negative bias is less than or equal to −0.5 KV and greater than or equal to −1 KV.

Figure 4B:
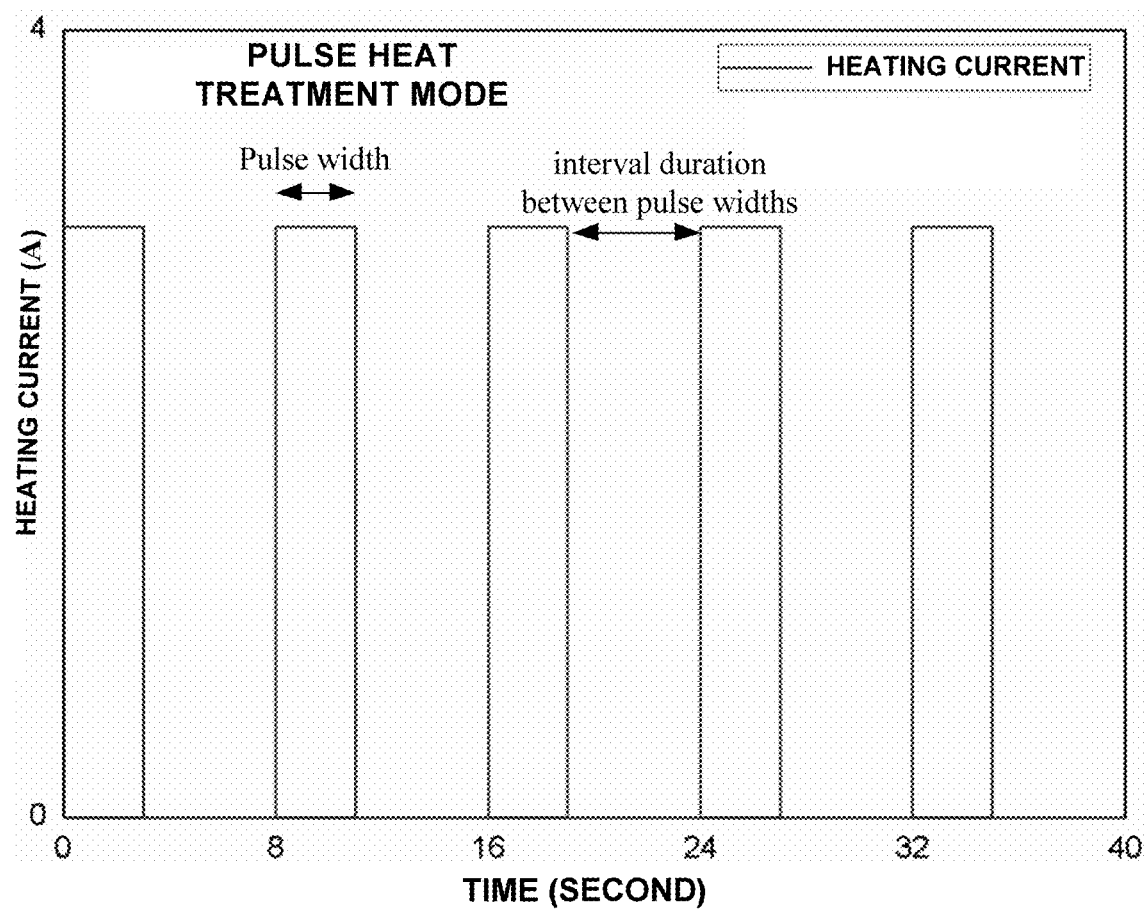
FIG. 4B schematically shows a schematic diagram of a pulse heat treatment mode in accordance with an embodiment of the present disclosure.

FIG. 4B schematically shows a schematic diagram of a pulse heat treatment mode in accordance with an embodiment of the present disclosure.

As shown in FIG. 4B, in the pulse heat treatment mode, the bias voltage may or may not be applied. The pulse heat treatment mode at a medium temperature, such as 500 to 1000 K (the heating temperature may be different from the continuous heating temperature, and the pulse mode may provide a temperature slightly higher than the continuous heating), may be adopted.

In FIG. 4B, there is a short stop heating time between the pulses. For example, the electron source may be heated by passing a current through the hairpin, and the device refers to the device shown in FIG. 2. In this temperature range, each heating pulse may last less than 10 s, for example, 2 to 3 seconds, and the heat treatment may be performed with multiple pulses. In order to avoid mutual interference between successive pulses, the interval between adjacent pulses may be increased, generally greater than 3 seconds. The pulse heat treatment may be supplemented with a bias voltage (the bias voltage may be positive or negative). In addition, the application period of the bias voltage may be the same as the pulse period of the pulse heat treatment, and the bias voltage may also be applied during part or all of the heat treatment, which is not limited herein.

In the above-mentioned pulse heat treatment operation, damage to the protrusions of the tip may be caused. In particular, the cumulative effect of long-term treatment eventually leads to deformation of the protrusions of the tip, resulting in a significant drop in the emission capability. The tip deformation may be effectively avoided by adding a certain degree of bias (voltage) to the tip during heat treatment. Specifically, the following two modes may be used. First, a positive bias voltage (typically 0.5 to 2 kV) may be applied, and the absolute value of the maximum voltage should be less than the field evaporation voltage of the emission site (such as the H-W reaction product) on the surface of the tip. Second, a negative bias may be applied, and the voltage range also needs to be controlled so that the field emission of the tip is not significant, otherwise, the emitted electrons will excite the gas, which will continue to cause ion bombardment. When a negative bias is applied, the typical value may be −0.5 kV to −1 kV.

In general, ion bombardment is a more serious problem that is ubiquitous in the emission process. This problem exists even when emission current is very small and vacuum state is good (only to a lesser extent) and is unlikely to be avoided fundamentally. If not handled in time, the service life is hard to exceed 24 hours. It has been found through experiments that at the initial stage of the production of such dissociative substances, the dissociative substances may be detached from the surface of the tip by a higher temperature treatment (for example, >~700 K), wherein the higher the temperature, the more adequate the treatment. However, long-term high temperature treatment will result in the disappearance of the emission sites. In addition, since the emission sites are formed on the nanometer-like protrusions, these protrusions are also gradually deformed at high temperatures, which will lead to a decrease in emission capability, that is, a higher operating voltage is required. However, the gas molecules adsorbed on the surface of the tip and the above-mentioned dissociative substances may be effectively removed by the heat treatment method as described above, improving the case where the emission capability of the electron source decreases as the use time increases.

Figure 4C:
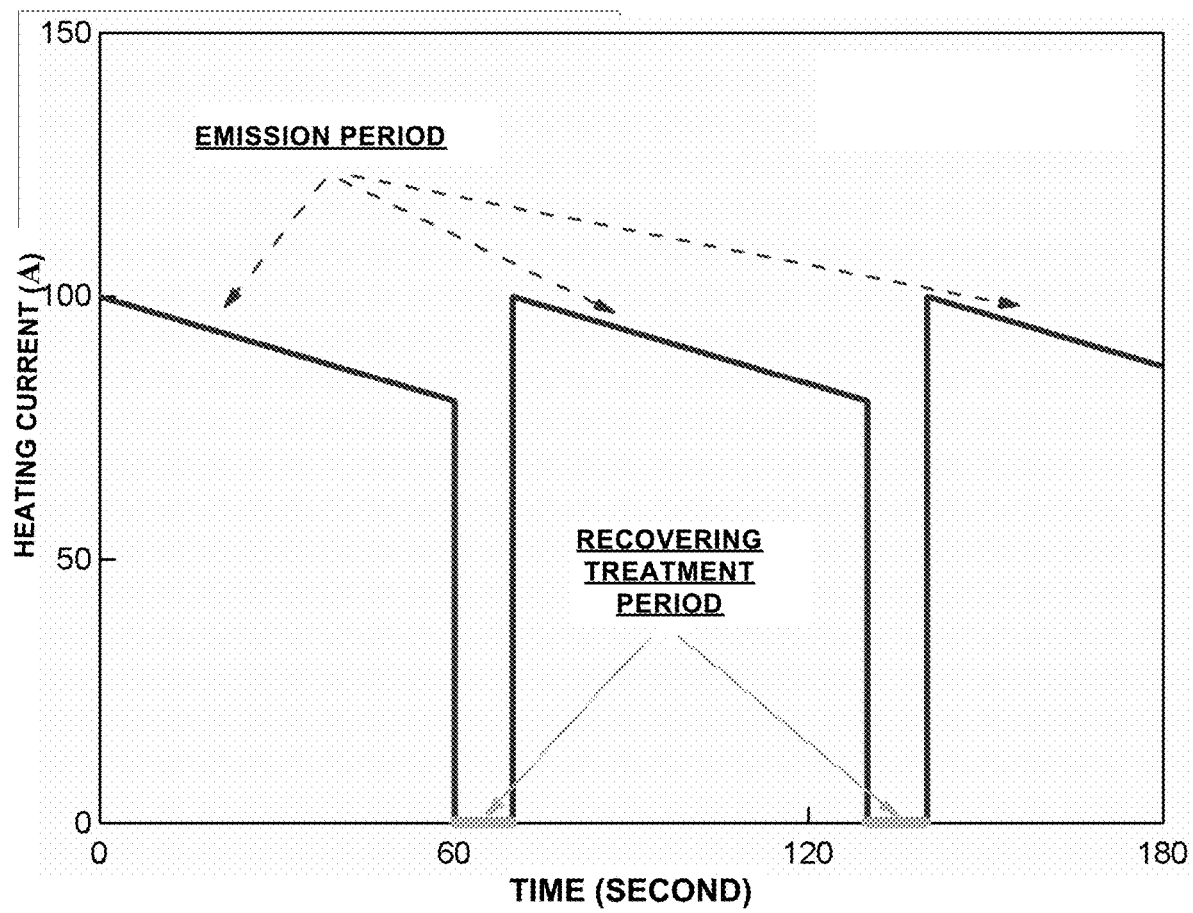
FIG. 4C schematically illustrates a schematic diagram of performing heat treatment on an electron source to recover emission capability in accordance with an embodiment of the present disclosure.

FIG. 4C schematically illustrates a schematic diagram of performing heat treatment on an electron source to recover emission capability in accordance with an embodiment of the present disclosure. As shown in FIG. 4C, the emission capability of the electron source may be effectively recovered by the above heat treatment. It should be noted that in the continuous heat treatment and/or the pulse heat treatment mode (with or without biasing), some of the emission sites are sometimes removed. In this case, the emission sites may be formed again in the area where the emission sites are removed to recover the initial emission state.

For example, by applying a positive or negative bias to the electron source, an electric field is formed on the surface of the tip so that metal atoms at the position of the removed emission site form a reaction product with the gas molecules as a new emission site. Specifically, when a negative bias is applied to form a emission site, first, a negative bias is applied to the tip to generate an emission current of microampere order which is maintained for a preset duration or the negative bias is adjusted until a predetermined value of the emission current is generated, and then, the negative bias is adjusted so that the emission current of the electron source is less than the order of milliamperes to avoid the deformation or burnout of the tip. When a positive bias is applied to form an emission site, a positive bias is applied to the tip and maintained for a preset duration, the value of the positive bias being less than the value of the field evaporation bias forming the tip.

When a positive bias is applied, the range of the formed field strength comprises 1 to 50 V/nm, and when a negative bias is applied, the range of the formed field strength comprises 1 to 30 V/nm.

Figure 4D:
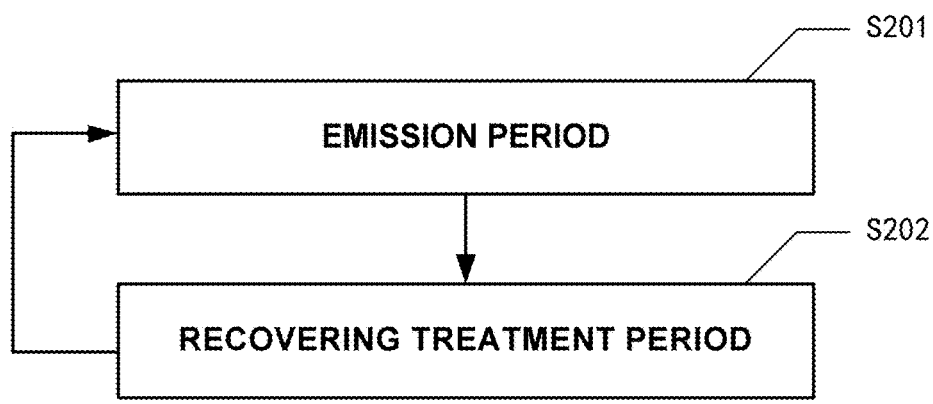
FIG. 4D schematically illustrates a flow chart of the operation mode of the tip in accordance with an embodiment of the present disclosure.

FIG. 4D schematically illustrates a flow chart of the operation mode of the tip in accordance with an embodiment of the present disclosure.

As shown in FIG. 4D, an operational mode as in FIG. 4C may be employed. The electron source is operated at a certain voltage. After a period of emission (emission period, S201), the emission capability decreases (that is, the field emission current decreases at the same voltage), and recovering treatment of the tip of the electron source (S202) may be performed to achieve the effect of eliminating gas adsorption and ion bombardment. The recovering treatment may include the aforementioned continuous heat treatment mode (with or without biasing) and/or the pulse heat treatment mode (with or without biasing). The emission capability is recovered after the treatment and the operation may be continued. That is to say, the above-mentioned emission period and recovering treatment period are continuously repeated, so that the electron source may be stably operated for a long period of time.

In order to further improve the stability of the emission and extend the operating time during the emission of the electron source, the electron source may be operated in the following temperature range. First, the electron source is operated at low temperatures (for example, <150 K), second, it is operated at higher temperatures (for example, >500 K). In addition, a continuous heating mode and/or a pulse heat treatment mode at a medium temperature may be performed in the emission period to synchronously eliminate gas adsorption and ion bombardment.

In the recovering treatment, the following treatment methods may be included. First, the continuous heat treatment mode: temperature <~800 K; second, the pulse heat treatment mode: 500 to 1000 K. In addition, when the heat treatment is performed, the tip may be applied with a bias voltage synchronously to prevent deformation.

Through the tip operation mode as shown in FIG. 4D, it is possible to continuously operate an electron source as described above for more than 1000 hours, greatly improving the service life of the electron source, and still maintaining a good emission state, for example, the extraction voltage being only less than 200 volts higher than it was at the beginning.

Figure 5:
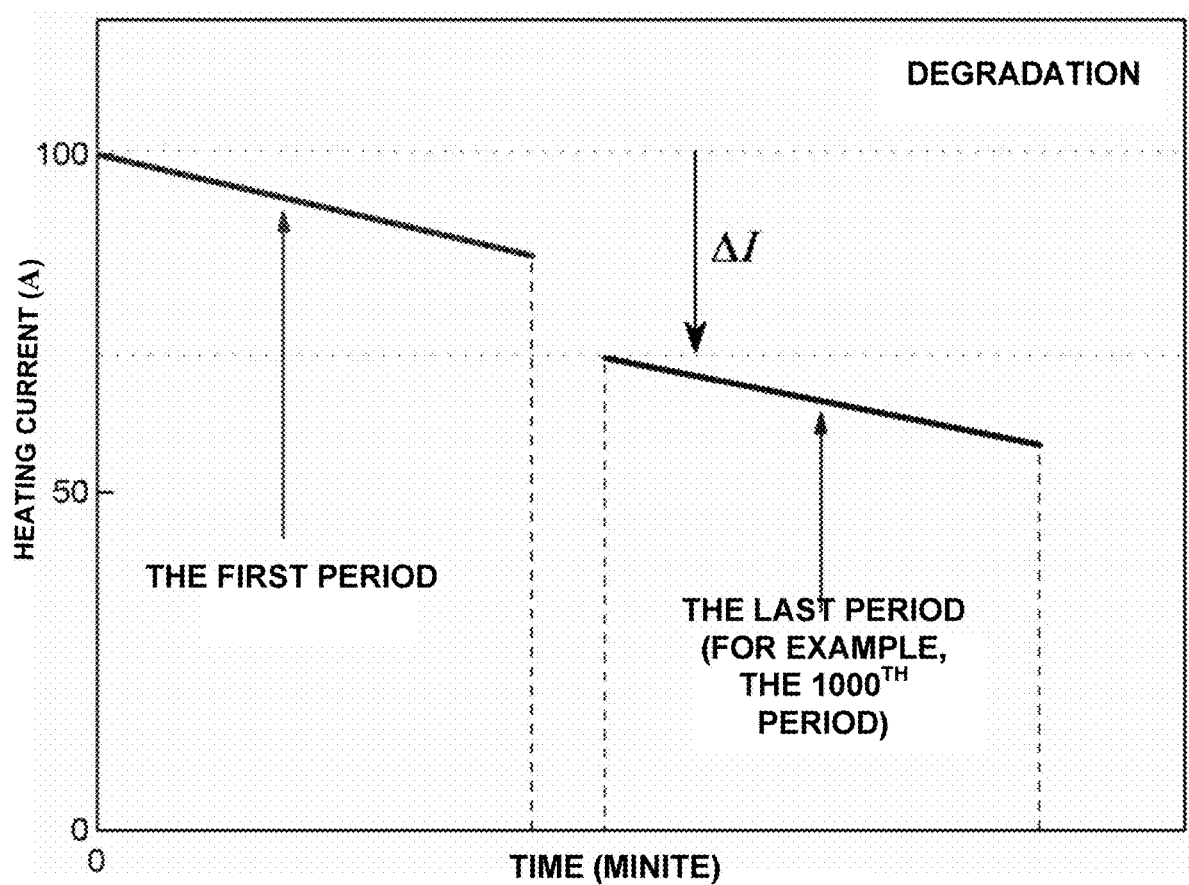
FIG. 5 schematically illustrates a schematic diagram of the degradation of the emission capability of the tip in accordance with the embodiment of this disclosure after long-term operation.

FIG. 5 schematically illustrates a schematic diagram of the degradation of the emission capability of the tip in accordance with the embodiment of this disclosure after long-term operation.

In this embodiment, as shown in FIG. 5, when the electron source is operated over a longer period of time (for example, 1000 service cycles, approximately 1000 hours), the emission capacity of the electron source is partially degraded, that is, at a certain voltage, the maximum emission capacity of the electron source is lower than that of the first cycle and cannot be recovered. However, the electron source may still be repaired to a large extent by heat treatment, specifically, in a continuous heat treatment mode (with or without biasing), or a pulse heat treatment mode at a medium temperature (with or without bias). Specifically, the temperature may be increased during intermittent heating or pulse heating during the repair, or the temperature may be increased during continuous heating or pulse heating during operation, or the operating temperature may be raised during the operating process. It should be emphasized that the conditions for the electronic source to be repaired are not limited and may be customized by the user.

Specifically, the method may further include: performing a emission site repair on the electron source.

Performing the emission site repair on the electron source may include the following operations: first, removing at least one emission site on the surface of the tip of the electron source, and then forming a new emission site on the surface of the tip, the new emission site being a reaction product formed by metal atoms of the surface of the tip and gas molecules under an electric field. For the method of forming a new emission site, reference may be made to the method for forming a new emission site in the above embodiment, and details are not described herein again. The temperature may be increased during intermittent heating during the repair, or the temperature may be increased during heating during operation, or the operating temperature may be raised during the operating process.

In a specific embodiment, removing at least one emission site on the surface of the tip of the electron source may include the following operations: for example, removing at least one emission site on the surface of the electron source by heating or field evaporation, wherein, when removing at least one emission site on the surface of the electron source by heating, a temperature of the heating is lower than a minimum value in a disappearance temperature of an electron source base and a disappearance temperature of metal atoms of the surface of the tip, or a temperature of the heating is lower than a minimum value in a disappearance temperature of an electron source base, a disappearance temperature of metal atoms of the surface of the tip, and a disappearance temperature of a high field strength structure when the emission site is on the high field strength structure of the electron source base.

It should be noted that, during the heating process, the electron source may be applied with a bias as an auxiliary, and applying a bias to the electron source as an auxiliary includes any one or more of the following: applying a positive bias as an auxiliary, applying a negative bias as an auxiliary, or applying a combination of a positive bias and a negative bias as an auxiliary.

When removing at least one emission site on the surface of the electron source by field evaporation, a value of a positive bias applied by the field evaporation is lower than a minimum value in a positive bias corresponding to disappearance of an electron source base and a positive bias corresponding to disappearance of metal atoms of the surface of the tip, or a value of a positive bias applied by the field evaporation is lower than a minimum value in a positive bias corresponding to disappearance of an electron source base, a positive bias corresponding to disappearance of metal atoms of the surface of the tip, and a positive bias corresponding to disappearance of a high field strength structure when the emission site is on the high field strength structure of the electron source base.

For example, first, emission sites with degraded emission capacity on the surface should be removed by increasing the temperature and number of times (for example, hundreds of times) of heat treatment pulses, or emission sites with degraded emission capacity on the surface may be removed by applying a positive bias (the positive bias should not completely evaporate the protrusions); then emission sites may be formed again on the surface of the tip by means of re-growth. However, it should be noted that the temperature of the pulse heat treatment should not exceed 1000 K, otherwise it will easily lead to the destruction of the protrusions on the surface of the tip, which requires the introduction of a new electron source. It should be noted that the most reliable method for extending the use time is to operate under high vacuum (<$10^{-7}$ Pa). If the vacuum is worse, the operating current must be reduced to ensure the running time.

The solution for tip burnout is as follows.

According to a large number of test experiments on the above electron sources (as described above), both ion bombardment and surface dissociation will result in burnout of the tip. This is often fatal. Specifically the following schemes are provided to avoid burnout.

First, provide a higher degree of vacuum. Under higher vacuum (P<$10^{-6}$ Pa): it is particularly desirable to keep the vacuum near the tip (local pressure) less than this order of magnitude. In this case, the effect of ion bombardment is not significant. However, it is still necessary to control the emission current IE. The yield of dissociative substances caused by ion bombardment on the surface of the tip is approximately proportional to I×P.

Secondly, provide a higher operating temperature, for example, an operating temperature of 500 K to 800 K, which is effective in avoiding burnout. This temperature range avoids the formation of surface dissociation. However, for a long time at higher temperatures, such as >1000 K, the emission sites of the above electron sources will disappear, for example, the reaction products of tungsten atoms and gas molecules will decompose.

Or, provide a lower operating temperature, for example, an operating temperature of <150 K. In this case, effectively lowering the temperature may delay the movement of dissociative substances (whether produced by ion bombardment or surface dissociation) to the emission area, and at the same time, cooling of the tip may also improve the vacuum of the local area of the tip, which also helps to delay the burnout.

Alternatively, the above-mentioned heat treatment (including continuous heat treatment or pulse heat treatment, etc.) for improving the gas adsorption problem may also effectively improve the burnout problem caused by ion bombardment and surface dissociation. Meanwhile, providing a higher vacuum may also greatly reduce the probability of gas adsorption and thus improve the gas adsorption problem; and providing a high operating temperature or a lower operating temperature may also improve the gas adsorption problem.

Further, preferably, the emission site is a hydrogen tungsten compound. As the emission site, the hydrogen tungsten compound has a low extraction voltage and a low yield of ion bombardment of dissociative substances. The produced dissociative substances have a low energy and a slow moving speed to the emission area, so the burnout may also be delayed.

A person skilled in the art may understand that, the features described in the various embodiments and/or claims of the present disclosure may be combined or conjuncted in various ways even if such combinations or conjunctions are not explicitly described in the present disclosure. In particular, various combinations and/or conjunctions of the features described in the various embodiments and/or claims of the present disclosure may be made without departing from the spirit and scope of the present disclosure. All such combinations and/or conjunctions are within the scope of this disclosure.

Although the present disclosure has been shown and described with reference to specific exemplary embodiments thereof, it will be understood by those skilled in the art that various changes in form and detail may be made without departing from the spirit and scope of the disclosure, as defined by the appended claims and their equivalents. Therefore, the scope of the disclosure should not be limited to the above-described embodiments, but should be determined not only by the appended claims but also by equivalents of the appended claims.

What is claimed is:

1. An electron source operating method which is applied for an electron source, the electron source is a field emission electron source comprising a tip and at least one emission site fixed on the tip, wherein the tip comprises a surface of the tip, wherein the emission site is a reaction product formed by metal atoms of the surface of the tip and gas molecules under an electric field, wherein the reaction is carried out without an ion bombardment, wherein the emission site is rooted on the surface of the tip, and wherein the electron source operating method comprises:
    emitting electrons by controlling operating parameters of the electron source,
    wherein the operating parameters of the electron source comprise an operating bias and one or more of an operating temperature or an operating pressure of an environment in which the electron source is located, and
    wherein the operating temperature is less than or equal to 1000 K and the operating pressure is less than or equal to $10^{-3}$ Pa, or the operating temperature is less than or equal to 150 K and the operating pressure is less than or equal to 1E$^{-6}$ Pa, or the operating temperature is less than or equal to 800 K and greater than or equal to 500 K and the operating pressure is less than or equal to 1E$^{-6}$ Pa.

2. The method of claim 1, further comprising:
    performing heat treatment on the electron source before or after the electron source emits electrons.

3. The method of claim 2, wherein the performing heat treatment on the electron source before or after the electron source emits electrons comprises one or more of a continuous heat treatment or a pulse heat treatment.

4. The method of claim 3, wherein the continuous heat treatment comprises:
    continuously heating the electron source, wherein a temperature of the heating is lower than a minimum value in a disappearance temperature of an electron source base, a disappearance temperature of metal atoms of the surface of the tip and a disappearance temperature of the emission site, or
    a temperature of the heating is lower than a minimum value in a disappearance temperature of an electron source base, a disappearance temperature of metal atoms of the surface of the tip, a disappearance temperature of the emission site, and a disappearance temperature of a high field strength structure when the emission site is on the high field strength structure of the electron source base; and
    maintaining the temperature of the electron source for a first set time period $t_c$.

5. The method of claim 4, wherein the temperature of the electron source is less than or equal to 800 K, and the first set time period $t_c$ is less than or equal to 20 min.

6. The method of claim 3, wherein the pulse heat treatment comprises:
heating the electron source in a pulsed manner, wherein a pulse width $t_1$ is less than or equal to a pulse time period threshold, and an interval duration between pulse widths $t_2$ is greater than or equal to an interval duration threshold,
wherein, a temperature of the heating is lower than a minimum value in a disappearance temperature of an electron source base, a disappearance temperature of metal atoms of the surface of the tip and a disappearance temperature of the emission site, or
a temperature of the heating is lower than a minimum value in a disappearance temperature of an electron source base, a disappearance temperature of metal atoms of the surface of the tip, a disappearance temperature of the emission site, and a disappearance temperature of a high field strength structure when the emission site is on the high field strength structure of the electron source base.

7. The method of claim 6, wherein the temperature of the electron source is less than or equal to 1000 K and greater than or equal to 500 K, the pulse time period threshold is less than or equal to 10 s, and the interval duration threshold is greater than or equal to 3 s, or
the temperature of the electron source is less than or equal to 1000 K and greater than or equal to 800 K, the pulse time period threshold is less than or equal to 3 s and greater than or equal to 2 s, and the interval duration threshold is greater than or equal to 3 s.

8. The method of claim 3, further comprising:
applying a bias to the electron source as an auxiliary during the continuous heat treatment or the pulse heat treatment.

9. The method of claim 8, wherein the applying a bias to the electron source as an auxiliary comprises one or more of applying a positive bias as an auxiliary, applying a negative bias as an auxiliary, or applying a combination of a positive bias and a negative bias as an auxiliary.

10. The method of claim 9 wherein when applying a positive bias as an auxiliary, a value of the positive bias is less than a voltage value corresponding to a field evaporation of the emission site, or
when applying a negative bias as an auxiliary, an absolute value of the negative bias is less than a voltage value corresponding to a first emission current threshold of the electron source.

11. The method of claim 10, wherein the value of the positive bias is less than or equal to 2 KV and greater than or equal to 0.5 KV, or the value of the negative bias is less than or equal to $-0.5$ KV and greater than or equal to $-1$ KV.

12. The method of claim 3, further comprising:
performing a emission site repair on the electron source, wherein the performing the emission site repair on the electron source comprises:
removing at least one emission site on the surface of the tip of the electron source; and
forming a new emission site on the surface of the tip, wherein the new emission site is a reaction product formed by metal atoms of the surface of the tip and gas molecules under an electric field.

13. The method of claim 12, wherein the removing at least one emission site on the surface of the tip of the electron source comprises:
removing at least one emission site on the surface of the electron source by heating or field evaporation,
wherein, when removing at least one emission site on the surface of the electron source by heating, a temperature of the heating is lower than a minimum value in a disappearance temperature of an electron source base and a disappearance temperature of metal atoms of the surface of the tip, or
a temperature of the heating is lower than a minimum value in a disappearance temperature of an electron source base, a disappearance temperature of metal atoms of the surface of the tip, and a disappearance temperature of a high field strength structure when the emission site is on the high field strength structure of the electron source base,
wherein, during the heating, the electron source is applied with a bias as an auxiliary, and applying a bias to the electron source as an auxiliary comprises one or more of applying a positive bias as an auxiliary, applying a negative bias as an auxiliary, or applying a combination of a positive bias and a negative bias as an auxiliary, and
wherein when removing at least one emission site on the surface of the electron source by field evaporation, a value of a positive bias applied by the field evaporation is lower than a minimum value in a positive bias corresponding to disappearance of an electron source base and a positive bias corresponding to disappearance of metal atoms of the surface of the tip, or
a value of a positive bias applied by the field evaporation is lower than a minimum value in a positive bias corresponding to disappearance of an electron source base, a positive bias corresponding to disappearance of metal atoms of the surface of the tip, and a positive bias corresponding to disappearance of a high field strength structure when the emission site is on the high field strength structure of the electron source base.

14. The method of claim 1, wherein the operating temperature is lower than a minimum value in a disappearance temperature of an electron source base, a disappearance temperature of metal atoms of the surface of the tip, and a disappearance temperature of the emission site, or
the operating temperature is lower than a minimum value in a disappearance temperature of an electron source base, a disappearance temperature of metal atoms of the surface of the tip, a disappearance temperature of the emission site, and a disappearance temperature of a high field strength structure when the emission site is on the high field strength structure of the electron source base.

15. The method of claim 1, wherein the operating bias applied when the electron source emits electrons comprises one or more of a continuous bias or a pulse bias.

16. The method of claim 1, wherein the emission site is a hydrogen tungsten compound.

17. The method of claim 1, further comprising:
performing heat treatment while the electron source emits electrons.

18. The method of claim 17, wherein the performing heat treatment while the electron source emits electrons comprises one or more of a continuous heat treatment or a pulse heat treatment.

19. The method of claim 1, further comprising:
performing heat treatment on the electron source before or after the electron source emits electrons; and performing heat treatment while the electron source emits electrons.

* * * * *